United States Patent
Kemp

(10) Patent No.: US 6,746,128 B2
(45) Date of Patent: Jun. 8, 2004

(54) ULTRA-HIGH RESOLUTION IMAGING DEVICES

(76) Inventor: Malcolm Hugh David Kemp, 29 Woodwarde Road, London, SE22 8UN (GB)

( * ) Notice: Subject to any disclaimer, the term of this patent is extended or adjusted under 35 U.S.C. 154(b) by 0 days.

(21) Appl. No.: 10/221,934

(22) PCT Filed: Mar. 16, 2001

(86) PCT No.: PCT/GB01/01161
§ 371 (c)(1),
(2), (4) Date: Sep. 16, 2002

(87) PCT Pub. No.: WO01/69299
PCT Pub. Date: Sep. 20, 2001

(65) Prior Publication Data
US 2004/0036991 A1 Feb. 26, 2004

(30) Foreign Application Priority Data
Mar. 17, 2000 (GB) .............................. 0006330

(51) Int. Cl.⁷ .................................................. G02B 5/10
(52) U.S. Cl. ...................... 359/858; 359/850; 359/869; 359/900
(58) Field of Search ................. 359/850, 857, 359/858, 868, 869, 900

(56) References Cited
U.S. PATENT DOCUMENTS
4,357,075 A * 11/1982 Hunter ..................... 359/858
4,655,555 A * 4/1987 Machler et al. ........... 359/365

FOREIGN PATENT DOCUMENTS
DE 2916741 A * 11/1980
GB 717787 A * 11/1954

* cited by examiner

Primary Examiner—Mark A. Robinson
(74) Attorney, Agent, or Firm—Richard A. Nebb; Dergosits & Noah, LLP

(57) ABSTRACT

The invention provides an ultra-high numerical aperture imaging device (1) comprising two rotationally symmetric curved mirrors (11h, 12b), which can be used to achieve very high concentrations of light or other sorts of wave (or other sorts of physical entities that satisfy equivalent "ballistic" equations of motion) or can be used in reverse to form a beam that has a small angle spread, and which can be combined with a further plane, partially transparent mirror (if necessary with additional components to attenuate and rotate the polarisation of the waves involved), to create a device able to achieve a materially better resolution than that implied by the traditional Rayleigh resolution criterion. A detailed method for designing such a device is also disclosed.

27 Claims, 4 Drawing Sheets

3D Plot for mirror surfaces defined by b=1, k=0.25, q=1.832

3D Plot for mirror surfaces defined by b=1, k=0.25, q=0.9682

3D Plot for mirror surfaces defined by b=1, k=0.7071, q=0.7071

Enlargement of area "A" of Fig.6

Enlargement of area "B" of Fig.6

Rays from lithographic mask to Imaging Device

ULTRA-HIGH RESOLUTION IMAGING DEVICES

The present invention relates to ultra-high resolution imaging devices, including devices using light or other sorts of electromagnetic waves for high resolution lithography for, say, semiconductor or microchip manufacture. The invention involves a combination of an ultra-high numerical aperture imaging system in conjunction with a suitably structured mirror and other associated components designed to result in the boundary conditions to the wave equation arising from the device more nearly approximating to that required to generate an imploding dipole solution to Maxwell's equations. The invention also provides an ultra-high numerical aperture imaging system using two suitably shaped reflectors, of relatively simple construction which have further potential uses beyond those conventionally relating to ultra-high resolution.

In the context of the present invention "ultra-high resolution" means having a resolving power better than that implied by the Rayleigh resolution criterion and "ultra-high numerical aperture" means that the range of angles that rays make when striking the image plane (if the device is being used to concentrate light) span a high proportion of the total $2\pi$ it steradians possible for light falling onto one side of a plane. To create sharp images (at least for small objeds), an optical system needs to be aplanatic. Geometrical optical theory indicates that such a system must have at least two surfaces at which the waves are deflected, see e.g. Schulz, G. "Higher order aplanatism", *Optics Communications*, 41, No 5, 315–319 (1982). The invention provides a two-mirror aplanatic lens arrangement that simultaneously facilitates ultra-high resolution and achieves a very high angle span into a plane.

Attempts to achieve a complete angle span using a combination of a mirror and a refracting surface, rather than two mirrors, have previously been described by Benitez, P. and Miñano, J. C. Ultrahigh-numerical-aperture imaging concentrator, *J. Opt. Soc. Am. A* 14, No 8, 1988–1997 (1997), and in other papers by the same authors. However, the mirror plus refractor arrangement they describe requires the image plane to be embedded within a material with refractive index greater than unity, which is considerably less practical than an approach in which both deflecting surfaces are mirrors.

Benitez and Miñano appear to have developed their ideas from non-imaging systems of relatively similar layout that were able to achieve very high concentrations for sources that were not very small. Their imaging layouts are in effect limiting cases of their non-imaging systems when the (far away) source object becomes very small. Other more traditional forms of non-imaging system are known, such as the Compound Parabolic Concentrator (CPC) described in Welford, W. T. & Winston, R. *High collection nonimaging optics* (Academic Press, 1989). However, the present invention differs from these systems in that it is imaging rather than non-imaging and, as is apparent from a cross-section taken through an axis of symmetry, a device according to the present invention comprises two separate deflecting surfaces not one, as is the case with a CPC. Additionally, in the limit for the CPC as the (far away) source becomes small, the CPC simply becomes arbitrarily long. A device according to the present invention is readily distinguishable.

Some aplanatic two-mirror arrangements have also been previously described. These include:

(a) Siemens-Reiniger-Werke Aktiengesellschaft "Improvements in or relating to optical mirror systems having aspherical surfaces", in GB Patent No GB 0 717 787 (1952). This patent describes a two-mirror aplanalic device, without explicitly specifying any limitation on the numerical aperture involved. However, it does not indicate how to achieve an ultra-high numerical aperture, nor do the Figures that it contains envisage such a device. The patent relates primarily to the design of X-ray telescopes which, because of the physical nature of reflection of X-rays, would not work if the device involved had a very high numerical aperture. Furthermore, despite making reference to a two-mirror aplanatic device, the Siemens-Reiniger-Werke Aktiengesellschaft patent does not indicate how to define the shape of the two mirrors involved.

(b) Mächler, Glück, Sclemmer and Bittner "Objective with aspheric surfaces for imaging microzones", in U.S. Pat. No. 4,655,555 (1984) concentrates on mirrors that use total internal reflection. It includes reference to a special case of an aplanatic two-mirror arrangement involving two confocal equally-sized ellipsoids. It concentrates on other confocal mirror arrangements (as does Hunter "Confocal reflector system" in U.S. Pat. No. 4,357,075 (1980)), although these mirror lay-outs are not actually aplanatic except in the special case of the two confocal equally-sized ellipsoids). However, U.S. Pat. No. 4,655,555 also refers to an article by Lawrence Mertz entitled "Geometrical Design for Aspheric Reflecting Systems". *Applied Optics*, 18, pages 4182–4186 (1979), which does appear to describe (in its FIG. 10) a very high numerical aperture aplnatic two-mirror arrangement, again focusing on microscopy. Pioneer "Manufacture of reflective type multiple-degree aspherical optical control system" in Japanese Patent JP 57141613 (1981) refers to an efficient means of producing a two mirror aplanatic arranement using a grip and press work plated by aluminium by vapour deposition.

(c) Döring in German Patent DE 2916741 notes that such arrangerrents can be used as optical collectors for solar cells, and the figures suggest reference to aptanatic rather than merely confocal arrangements.

However, none of the above indicate how the precise positioning of the mirrors can be identified. The present invention therefore embodies a significant departure from and advance over the various prior art systems not only because it refers to ultra-high resolution devices but also because it provides a simple methodology for identifying the precise positioning of such aplanatic mirror pairs. In certain preferred embodiments it also incorporates other refinements not described in the above references.

According to one aspect of the present invention a high numerical aperture imaging device comprises first and second axially-symmetric curved mirrors for focussing the image of an object onto an image plane, wherein the first and second curved mirrors are arranged to effectively create inwardly imploding dipole-like solutions to the applicable wave equation, to concentrate the light flux arriving at the image plane from a given point in the object more than would be possible were the image formation to be subject to the diffraction limits that generally apply to far field devices.

In a preferred embodiment, the device further comprises a plane mirror, wherein the plane mirror is partially transparent and is positioned in or closely adjacent to the image plane.

A device according to the invention may further comprise a wave attenuation element and/or wave polarisation-rotating element to attenuate and/or rotate the polarisation of the waves traversing the device so that the spatial distribution of the amplitude and polarisation of a wavefront as it approaches the plane mirror is rendered more closely consistent with that required to generate dipole-like solutions to the wave equation.

Two mirror ultra-high numerical aperture imaging devices according to the invention may have practical application for several possible uses, including, for example:

(a) use to concentrate sunlight to a high temperature, indeed the second law of thermodynamics indicates that the temperatures reached could be dose to the temperature of the sun's photosphere, i.e. to in excess of 4,000° K. At such temperatures, unusual ways of converting sunlight to electric power (e.g. use of thermionic emission) could be facilitated by a device according to the invention;

(b) as solar concentrators made out of lightweight mirrors (for example, using thin films whose shapes remain stable because of rotation [which may require only an initial impetus in a suitable frictionless environment, such as a vacuum, or which could otherwise be achieved with a suitable drive mechanism] or because they are part of an inflated device) such that the power to weight ratio of such an apparatus if used with a lightweight way of converting sunlight to energy could be sufficiently high to permit powered flight (e.g. the sunlight could be used to create direct thrust by evaporation of a solid or liquid propellant);

(c) to concentrate other types of waves such as sound waves or other sorts of electromagnetic radiation like radio waves (e.g. as an alternative to existing parabolic satellite TV dish design);

(d) (when used in reverse) to create narrow beams, e.g. efficient beam formation from light emitted by a light emitting diode in say an optical network;

(e) to create uffra-high resolution imaging devices probably in tandem with additional "near field" components;

(f) for concentrating or projecting objects such as gas or dust particles (the trajectories of objects travelling "allistically" are the same as light rays, i.e. straight lines until the object bounces off a surface in the same sort of fashion as a light ray bounces off a mirror, thus the same layouts might also be relevant in the context of such "ballistic" materials).

In such examples, an ultra high numerical aperture usually provides advantages, e.g. in (a) and (b) it makes it possible to approach more closely the temperature defining the thermodynamic upper limit, in (c) it improves the quality of the signal received for the same aperture area, in (d) it reduces the power required for the same usable energy output and in (e) it ensures that the required boundary conditions can approximate those required to generate an imploding dipole solution to the wave equation. [The "traditional" parabolic dish achieves about ¼ of the thermodynamic ideal according to Welford, W. T. & Winston, R. High collection nonimaging optics (Academic Press, 1989).]

Alternative embodiments according to the present invention may include one or more additional focussing mirrors (above two) and/or non-imaging elements for further improving the device to achieve higher order aplanatism.

The invention further provides a method for designing the curved mirrors for use in such high numeric aperture imaging devices.

The various aspects of the invention and the principles underlying its operation will now be described in detail and by way of example with reference to the accompanying drawings, in which:

FIG. 1a is a graph of curves for defining the two-mirror surfaces of an embodiment of the invention by rotation about the x-axis;

FIG. 1b is a perspective view in 3-dimensions of the embodiment defined by the curves of FIG. 1a;

Figure 2:
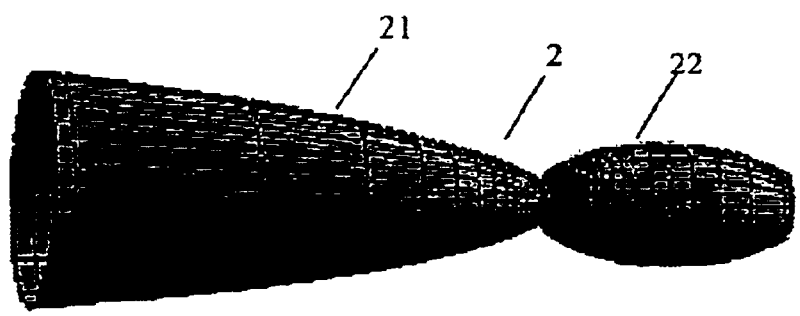
Figure 3:
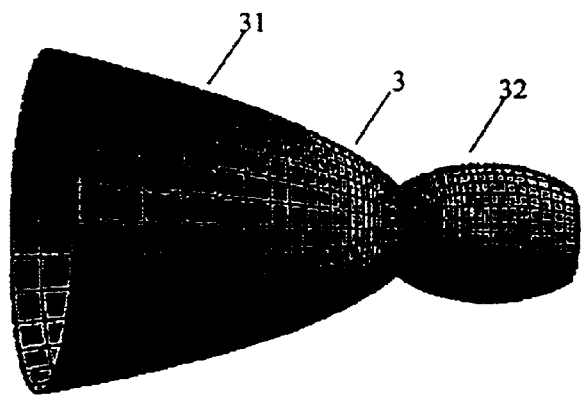
Figure 4:
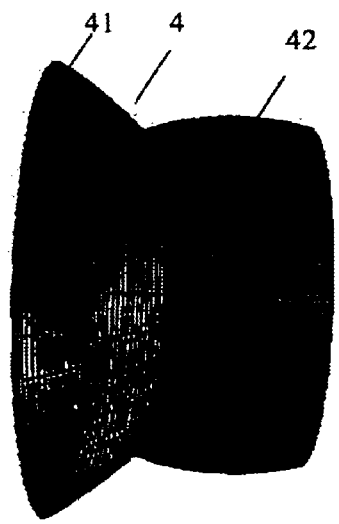
Figure 5:
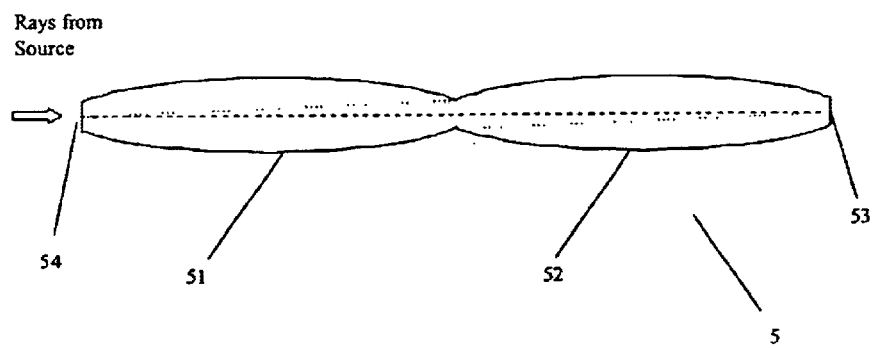
Figure 6:
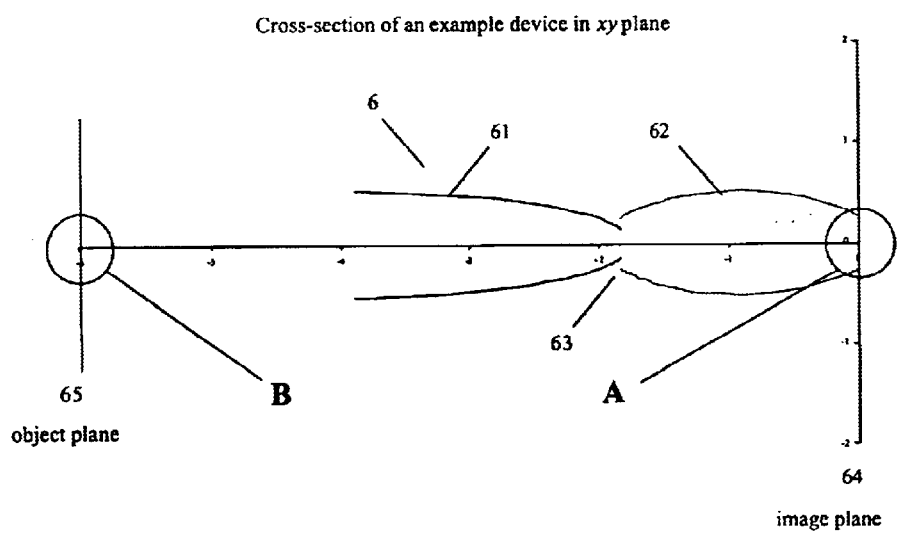
Figure 7:
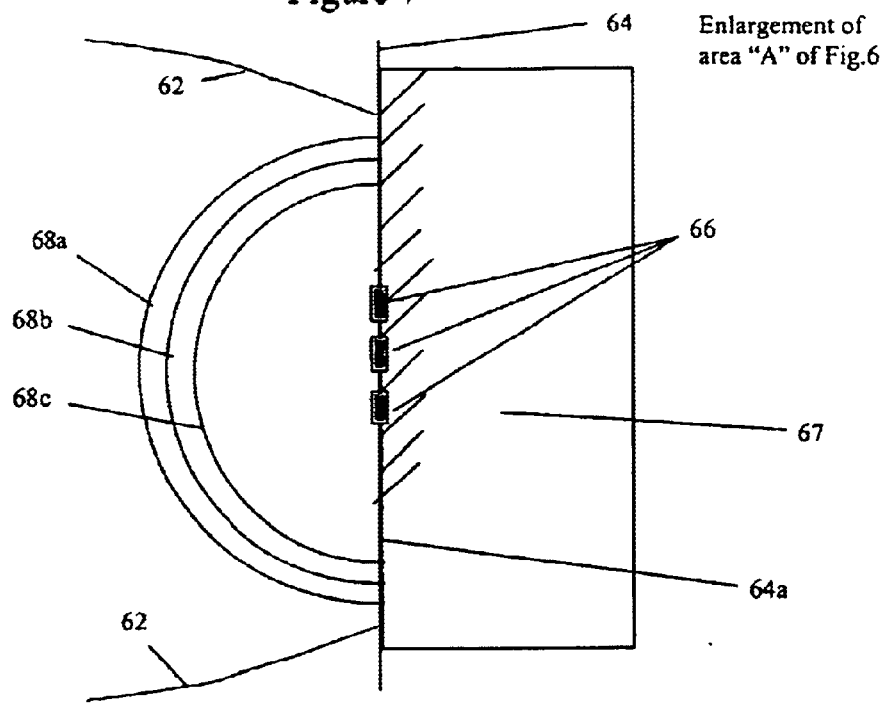
Figure 8:
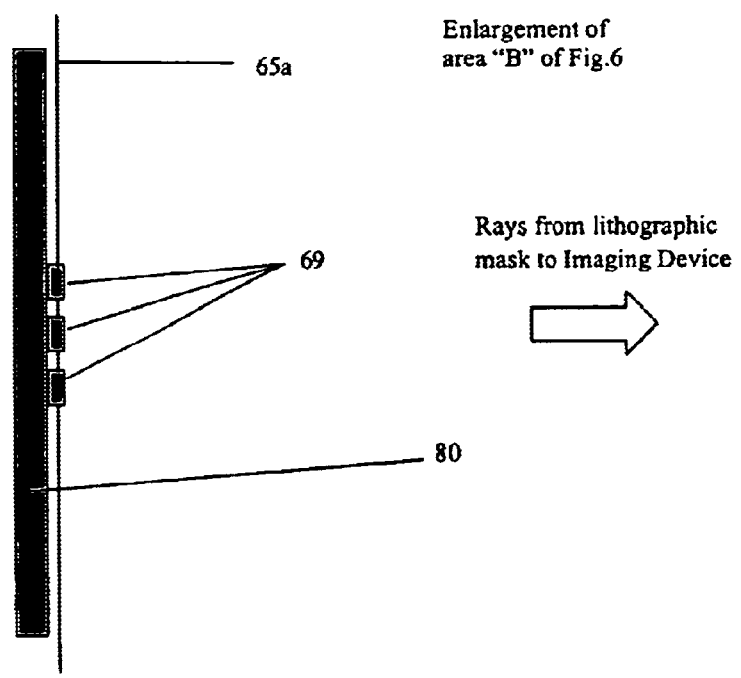

FIGS. 2, 3, and 4 are perspective, 3-D views of the mirror surfaces of alternative embodiments of the invention illustrating the differences resulting from variation of specified key parameters;

FIG. 5 is a cross-section of a further alternative embodiment of the present invention;

FIG. 6 is a cross-section of an embodiment of the present invention illustrating use for photolithography;

FIG. 7 is an enlarged cross-section of the portion of the image plane labelled "A" in FIG. 6; and FIG. 8 is an enlarged cross-section of the portion of the object plane labelled "B" in FIG. 6.

In all the figures, for use for high concentration/high resolution purposes, the object plane is situated to the left and the image plane is situated to the right.

For a two mirror layout to exhibit first order aplanatism when creating an image on the plane x=0 and centred on the origin, it is sufficient that the following conditions are satisfied:

(a) that the device is rotationally symmetric around, say, the x-axis, with the object plane (say at x=f);

(b) that it satisfies the sine criterion; and (c) that all light rays emanating from the point (f,h,0) in the object plane that reach the image plane having travelled in the plane z=0 need to go through a single point in the image plane, say (0,ZBh,0), for all sufficiently small h (B being the degree of magnification the device produces and hence independent of h, and Z being ±1 (or a constant multiple thereof), depending on whether the image is inverted or not).

The reason for sufficiency is that (a) and (c) taken together are equivalent to forming a crisp (aplanatic of order 1) image for rays remaining in a cross-section through the axis, and the further imposition of (b) means (for the right sign of Z) that the device continues to form a crisp image even if the rays do not remain wholly within this cross-section.

These requirements may be employed in an iterative process that identifies the positioning of each consecutive point of a cross-section through the x-axis of each mirror, in the following way. First, it is necessary to define some suitable notation. For example, suppose the cross-section is in the plane z=0. The x and y coordinates of each successive point on the two mirrors in this cross-section may be defined to be $M_1(t) \equiv (m_{1,x}(t), m_{1,y}(t), 0)$ (for the mirror nearest the object) and $M_2(t) \equiv (m_{2,x}(t), m_{2,y}(t), (t), 0)$ (for the mirror nearest the image), t being an iteration counter. The functions $M_0(t) \equiv (m_{0,x}(t), m_{0,y}(t), 0) \equiv (f, 0, 0)$ and $M_3(t) \equiv (m_{3,x}(t), m_{3,y}(t), 0) \equiv (0, 0, 0)$ are set to define the centres of the object and image planes respectively. For an imaging device, these would be constant and therefore would not vary as t changes (although if a non-imaging component is introduced as described below then they would vary to some extent).

Additionally, $a_1(t)$ and $a_2(t)$ are the angles that tangents to the first and second mirrors make to the z-axis, and $a_0(f)$ and $a_3(t)$ are the angles that the object and image planes make to the x-axis, i.e. 90° for all t (for the device to be rotationally symmetric about the x-axis), $d_i(t)$ (for i=0, 1, 2) is the angle that a ray from $M_i(t)$ to $M_{i+1}(t)$ makes to the x-axis and $p_i(t)$ (for i=0, 1, 2) is the distance between $M_i(f)$ and $M_{i+1}(t)$. Note that as the light is reflected at each mirror these can be found from the $M_i(t)$ as follows:

$$d_i(t) = \arctan\left(\frac{m_{i+1,y}(t) - m_{i,y}(t)}{m_{i+1,x}(t) - m_{i,x}(t)}\right)$$

$$a_i(t) = \frac{d_i(t)}{2} + \frac{d_{i-1}(t)}{2}$$

$$p_i(t) = \sqrt{(m_{i+1,x}(t) - m_{i,x}(t))^2 + (m_{i+1,y}(t) - m_{i,y}(t))^2}$$

The design process then proceeds iteratively as follows:

(1) Choose suitable parameters to define the size and shape of the device. For a far away source (which might be taken to be, say, $f=-10^9$, i.e. far away along the negative x-axis) the overall width of the device will be defined by the value of B. e.g. if $B=b/p_0(0)$ then the maximum width will be b (since the sine criterion implies that this will be the value of $m_{1,y}(t)$ corresponding to rays striking the image plane tangentially). So the scale of the device can be defined by taking, say, $b=1$. There are then two further parameters that define the shape of the device, which for simplicity can be $m_{2,y}(0)=k$ and $m_{2,x}(0)=-q$, say. It is possible to then take $m_{1,x}(0)=m_{2,x}(0)-\delta$, where for simplicity $\delta$ is very small (as this then defines one limit of the acceptable range of iterated values).

(2) Assign the following values to $m_{1,y}(0)$ and Z (these ensure that both at outset and as the iteration progresses the device satisfies the sine criterion, as long as h is small enough for that purpose):

$$Z = 1 \quad m_{1,y}(0) = -\frac{m_{2,y}(0)}{(m_{2,x}(0)^2 + m_{2,y}(0)^2)^{1/2}}$$

(3) Update the values of $M_1(t)$ and $M_2(t)$ using the following iterative formulae for a suitably small value of h:

$$M_i(t+1) \equiv \begin{pmatrix} m_{i,x}(t+1) \\ m_{i,y}(t+1) \end{pmatrix} = M_i(t) + w_i \begin{pmatrix} \cos(a_i(t)) \\ \sin(a_i(t)) \end{pmatrix} h$$

where $$w_2 = \frac{p_1 r_0}{p_0 s_2} \quad w_1 = -ZB\frac{p_1 s_3}{p_2 r_1}$$

and $r_{i-1}(t) = \sin(a_{i-1}(t) - d_{i-1}(t))$ $s_i(t) = \sin(a_i(t) - d_{i-1}(t))$ (4) Stop the iteration when $m_{2,x}(0)$ reaches zero (at which point light rays striking the image will do so tangentially).

(5) Rotate the curves thus produced, which define the shapes of the two mirrors, around the x-axis to form the complete two-mirror arrangement.

The formulae for $w_1(t)$ and $w_2(t)$ in step (3) can be derived in a variety of ways. One way is via trigonometry considering three different paths that rays must simultaneously be able to travel, which are (i) $M_0(0)$ to $M_1(t)$ to $M_2(t)$ to $M_3(0)$, (ii) $M_0(0)$+offset to $M_1(t)$ to $M_2(t+1)$ to $M_3(0)$+Offset and (iii) $M_0(0)$ to $M_1(t+1)$ to $M_2(t1)$ to $M_3(0)$, where "offset" means a point in the object plane and corresponding point in the image plane a small distance way from the center of the object. A more general way that can be extended to include more than two mirrors or deflectors other than mirrors (or with suitable modification to calculate the degree of aberration arising from a source being other than a single point, or to add back in a component of non-imaging behaviour—see below) is to determine the form of the function $E_i(g_i,g_{i-1})$ that represents the distance from $M_{i+1}(f)$ that a ray will strike the i+1'th surface if it comes from a point on the i−1'th surface that is a distance $g_{i-1}(f)$ from $M_{i-1}(f)$ via a point on the 1'th surface that is a distance $g_i$ from $M_i(t)$, for small $g_{i-1}$ and $g_i$. If deflection occurs by reflection then it can be shown that:

$$E_i(g_i, g_{i-1}) = \left(\frac{r_i}{s_{i+1}} - \frac{p_i s_i}{p_{i-1} s_{i+1}}\right) g_i + \left(\frac{p_i r_{i-1}}{p_{i-1} s_{i+1}}\right) g_{i-1} + \left(\frac{2p_i}{s_{i+1}}\right) a_i' g_i$$

where $a_i'(t) g_i$ is the difference between the angle that the ith mirror makes to the x-axis at point $M_i(t)$ and the angle that it makes at a distance $g_i$ from $M_i(t)$ (for a smooth surface this must be a linear function of $g_i$ for small $g_i$. $a_i'(t)$ being the derivative of $a_i(t)$ with respect to t). Requirement (c) is then equivalent to $w_1$, $w_2$, $a_1'w_1$ and $a_2'w_2$ satisfying the following four simultaneous equations:

$$w_2 h = E_1(w_1 h, 0) \quad 0 = E_2(w_2 h, w_1 h) \quad w_2 h = E_1(0, h) \quad ZBh = E_2(w_2 h, 0)$$

(the first two being equivalent to the requirement that rays starting from the centre of the object plane eventually strike the image plane at its centre, and the second two being equivalent to the requirement that rays starting a distance h away from the centre eventually strike the image plane a distance ZBh from its centre), $w_1(t)$ and $w_2(t)$ must therefore satisfy the following relationships, which in turn lead to the formulae in step (3) of the iteration:

$$w_2 h = E_1(0, h) = \frac{p_1 r_0 h}{p_0 s_2} \quad 0 - ZBh = (E_2(w_2 h, w_1 h) - E_2(w_2 h, 0)) = \frac{p_2 r_1}{p_1 s_3} w_1 h$$

If the waves were deflected by refraction or diffraction then $E_i(g_i,g_{i-1})$ would need to be modified appropriately. To work out the degree of aberration (at least for rays remaining in a cross-sectional plane) $E_i(g_i,g_{1-1})$ is expanded in higher powers of $g_{i-1}$ and $g_i$ whilst still retaining the positioning defined above. For more than two deflecting surfaces then it is still possible to use the same sort of approach as above but there are then more unknowns than there are equations that need to be satisfied. The extra degrees of freedom that this introduces may be used to satisfy the additional equations required to achieve higher order aplanatism.

For example, considering a device with three or more mirrors or where deflection occurs via some other means, and where it is desired to arrange for the mirrors to exhibit higher order aplanatism whilst still providing an ultra-high numerical aperture device, the analysis may proceed as follows. Let the n deflecting surfaces now be $M_1(t)$, $M_2(t), \ldots, M_n(t)$ where $M_i(f) = (m_{i,x}(t), m_{i,y}(f))$, the object plane being $M_0(t)$ and the image plane being $M_{n+1}(t)$. As before, consider a ray that remains in the xy plane and that starts a distance $g_{i-1}$ along the (i−1)'th mirror from $M_{i-1}(f)$, which strikes the i'th mirror at a point $g_i$ from $M_i(t)$ and after deflection there strikes the (i+1)'th mirror at a distance $g_{i+1}$ from $M_{i+1}(t)$. Suppose that the angles the entry and exit rays at a deflecting surface, and the tangent to the deflecting surface make to the x-axis are $d_{entry}$, $d_{exit}$ and $a_{junc}$ respectively. Then $d_{exit} = f(a_{junc}, d_{entry})$ where f depends on the type of deflection that is occurring. For example, for reflection, refraction and diffraction:

$$f_{reflection}(a_{junc}, d_{entry}) = 2a_{junc} - d_{entry}$$

$$f_{refraction}(a_{junc}, d_{entry}) = a_{junc} - \pi/2 + \arcsin(N \sin(\pi/2 - a_{junc} + d_{entry}))$$

where $$N = \frac{n_{entry}}{n_{exit}}$$

since $$n_{exit} \sin(\pi/2 - a_{junc} + d_{exit}) = n_{entry} \sin(\pi/2 - a_{junc} + d_{exit})$$

and $n_{entry}$ and $n_{exit}$ are the refractive indices on the relevant sides of the refractor, and $$f_{diffraction}(a_{junc}, d_{entry}) =$$

$$a_{junc} - \pi/2 + \arcsin\left(\frac{m\lambda}{L} + \sin(\pi/2 - a_{junc} + d_{entry})\right)$$

where L is the distance between successive grating lines in the diffracting surface (assuming that the pattern can be modelled in some periodic fashion akin to a diffraction grating), and m is an integer representing the 'order' of the diffraction, since:

$$\sin(\pi/2 - a_{junc} + d_{exit}) = i n.\lambda/L + \sin(\pi/2 - a_{junc} + d_{entry})$$

For simplicity define $r_i$ and $s_i$ as before and:

$$X_{i-1}(t) = \cos(a_{i-1}(t) - d_{i-1}(t)) \quad Y_i(t) = \cos(a_i(t) - d_{i-1}(t))$$

and drop the parameter t for $d_i(t)$ etc., but retain the full expression whenever the parameter is different to t. Then, to first order, i.e. when $g_{i-1}$, $g_i$ and $g_{j+1}$ are small:

$$d_{entry} = d_{i-1} + \frac{g_i s_i - g_{i-1} r_{i-1}}{p_{i-1}}$$

$$a_{junc} = a_i + a_i' g_i$$

$$d_{exit} = d_i + \frac{g_{i+1} s_{i+1} - r_i m_i}{p_i}$$

$d_{exit} = f(a_{junc}, d_{entry})$ and $d_i = f(a_i, d_i) \rightarrow g_{i+1} = E_i(g_i, g_{i-1}) = L_{i,0} g_i + L_{i,1} g_{i-1} + H_i a_i' g_i$ where as previously, if deflection occurs by reflection:

$$L_{i,0} = \frac{r_i}{s_{i+1}} - \frac{p_i s_i}{p_{i-1} s_{i+1}} L_{i,1} = \frac{p_i r_{i-1}}{p_{i-1} s_{i+1}} \quad H_i = \frac{2p_i}{s_{i+1}}$$

However, it is possible to expand to higher powers of h, e.g. to expand to $$g_i = c_{i,1} h + c_{i,2} h^2 o(h^3).$$

Then:

$$c_{i+1,1} = E_{i,1}(c_{i,1}, c_{i-1,1}) \quad c_{i+1,2} = E_{i,1}(c_{i,2}, c_{i-1,2}) + E_{i,2}(c_{i+1,1}, c_{i,1}, c_{i-1,1})$$

where $$E_{i,1}(g_{i+1}, g_i, g_{i-1}) = E_i(g_{i+1}, g_i, g_{i-1}).$$

and for deflection by reflection it appears that:

$$E_{i,2}(g_{i+1}, g_i, g_{i-1}) =$$

$$\frac{p_i}{s_{i+1}} \left( \begin{array}{c} a_i'' g_i^2 - \frac{Y_{i+1} a_{i+1}' g_{i+1}^2 - X_i a_i' g_i^2}{2p_i} - \frac{Y_i a_i' g_i^2 - X_{i-1} a_{i-1}' g_{i-1}^2}{2p_{i-1}} + \\ \frac{(s_{i+1} g_{i+1} - r_i g_i)(Y_{i+1} g_{i+1} - X_i g_i)}{p_i^2} + \\ \frac{(s_i g_i - r_{i-1} g_{i-1})(Y_i g_i - X_{i-1} g_{i-1})}{p_{i-1}^2} \end{array} \right)$$

The degree of aberration G(h) arising from the two mirror arrangements described previously may then be derived as follows:

$$G(h) = \frac{g_4}{g_1} = \frac{ZBh + c_{4,2} h^2}{h} = ZB + c_{4,2} h + o(h^2)$$

where $c_{1,1} = 1 \quad c_{2,1} = 0 \quad c_{3,1} = ZB \quad c_{1,2} = 0 \quad c_{2,2} = 0$ $c_{3,2} = E_{2,1}(0,0) + E_{2,2}(c_{3,1}, c_{2,1}, c_{1,1}) = E_{2,2}(c_{3,1}, c_{2,1}, c_{1,1})$ and $c_{4,2} = E_{3,1}(c_{3,2}, 0) + E_{3,2}(c_{4,1}, c_{3,1}, c_{2,1})$ The term in a" can probably most easily be found by carrying out two consecutive iterations and calculating it from the difference of two consecutive values of a'.

If more mirrors are to be added, then by solving progressively more simultaneous equations it is possible to arrange for the power series expansion of G(h) to be arbitrarily dose to the thermodynamic ideal (which to second order is $ZBh+0.h^2$). For example, suppose a further reflector is to be added. There are then six simultaneous equations (to first order) that need to be satisfied, including a parameter Q which arises because it is not obvious at first sight where the off-centre light will strike the third mirror. They are:

$w_2 h = E_1(w_1 h, 0) \quad w_3 h = E_2(w_2 h, w_1 h) \quad 0 = E_3(w_3 h, w_2 h)$ $w_2 h = E_1(0, h) \quad Qw_3 h = E_2(w_2 h, 0) \quad ZBh = E_3(Qw_3 h, w_2 h)$ In fact, Q is constrained so that $(1-Q) = (ZB)/(L_{2,1} L_{4,1})$, but even taking this into account there are still just five unknowns but six simultaneous equations. This therefore introduces a degree of freedom which can then be varied to ensure that at each iteration G(h) has the form required for second order aplanatism, at least for rays that remain in the xy plane. A similar analysis must be carried out to ensure that second order aplanatism also arises for rays that do not remain within the xy plane (the paper by Schulz referred to above suggests that in general this may require a further mirror). The end result is as before an iterative process that simultaneously defines the location of each consecutive point along each mirror (for some suitably small h). Again this is seeded with parameters that will satisfy the sine criterion (and appropriate values for Z, B and h) and iterated forwards until the ray heading towards the image is tangential to the image plane. The same approach can be extended to higher aplanatic orders by introducing further terms such as $c_{i,3}$ and further functions $E_{i,3}$ and incorporating further mirrors in the iterative process.

The same framework can be used for monochromatic light deflected in a refractive or diffractive manner. If deflection occurs by refraction then it appears that:

$$L_{i,0} = \frac{r_i}{s_{i+1}} + \frac{Ns_i^2 p_i}{r_i s_{i+1} p_{i-1}} \quad L_{i,1} = -\frac{Ns_i p_i r_{i-1}}{r_i s_{i+1} p_{i-1}} \quad H_i = \frac{p_i(r_i - Ns_i)}{r_i s_{i+1}}$$

$$E_{i,2}(g_{i+1}, g_i, g_{i-1}) =$$

$$\frac{p_i}{r_i s_{i+1}} \left( \begin{array}{c} r_i \dfrac{Y_{i+1} a'_{i+1} g_{i+1}^2 - X_i a'_i g_i^2}{2p_i} - Ns_i \dfrac{Y_i a'_i g_i^2 - X_{i-1} a'_{i-1} g_{i-1}^2}{2p_{i-1}} - \\ \dfrac{(r_i - Ns_i)a''_i}{2} g_i^2 - r_i \dfrac{(s_{i+1} g_{i+1} - r_i g_i)(Y_{i+1} g_{i+1} - X_i g_i)}{p_i^2} + \\ Ns_i \dfrac{(s_i g_i - r_{i-1} g_{i-1})(Y_i g_i - X_{i-1} g_{i-1})}{p_{i-1}^2} \end{array} \right)$$

whilst for diffraction then it appears that:

$$L_{i,0} = \frac{p_i}{r_i s_{i+1}} \left( \frac{r_i^2}{p_i} + \frac{s_i^2}{p_{i-1}} \right) \quad L_{i,1} = -\frac{Ns_i p_i r_{i-1}}{r_i s_{i+1} p_{i-1}} \quad H_i = \frac{p_i(r_i - s_i)}{r_i s_{i+1}}$$

$$E_{i,2}(g_{i+1}, g_i, g_{i-1}) =$$

$$\frac{p_i}{r_i s_{i+1}} \left( \begin{array}{c} r_i \dfrac{Y_{i+1} a'_{i+1} g_{i+1}^2 - X_i a'_i g_i^2}{2p_i} - s_i \dfrac{Y_i a'_i g_i^2 - X_{i-1} a'_{i-1} g_{i-1}^2}{2p_{i-1}} - \\ \dfrac{(r_i - s_i)a''_i}{2} g_i^2 - r_i \dfrac{(s_{i+1} g_{i+1} - r_i g_i)(Y_{i+1} g_{i+1} - X_i g_i)}{p_i^2} + \\ s_i \dfrac{(s_i g_i - r_{i-1} g_{i-1})(Y_i g_i - X_{i-1} g_{i-1})}{p_{i-1}^2} \end{array} \right)$$

In both cases the development of two or more deflector arrangements (for monochromatic light) can proceed along the lines described previously for the reflective case, since the dependence on the type of deflection only arises within the terms $E_{i,1}$, etc. as described above, and in the determination of $a_{i,1+1}$ from $d_{i,1+1}$. For example, with refractive surfaces:

$$a_i = \arctan\left( \frac{N \cos(d_{i-1}) - \cos(d_i)}{\sin(d_i) - N \sin(d_{i-1})} \right)$$

It is worth noting that in contrast to the reflective case there may be combinations of $d_{i-1,t}$ and $d_{i,t}$ which cannot be achieved by any values of $a_{i,j}$. The constraints are (for refraction):

$$|d_i - d_{i-1}| \leq \frac{\pi}{2} - \arcsin\left(\frac{1}{N}\right)$$

if $N > 1$ or $|d_i - d_{i-1}| \leq \frac{\pi}{2} - \arcsin(N)$ if $N < 1$

When considering refractive or diffractive devices it may also be helpful to include within the formulae the impact of a change in $\lambda$, the wavelength of light. For refractive devices this involves introducing some power series expansion describing the dependency of N (the ratio of the entry to exit refractive indices) on $\lambda$. The degrees of freedom that arise when adding more deflectors can then be used to reduce the dependence of G(h) on $\lambda$ instead of (or in conjunction with) achieving higher order aplanatism.

Figure 1:
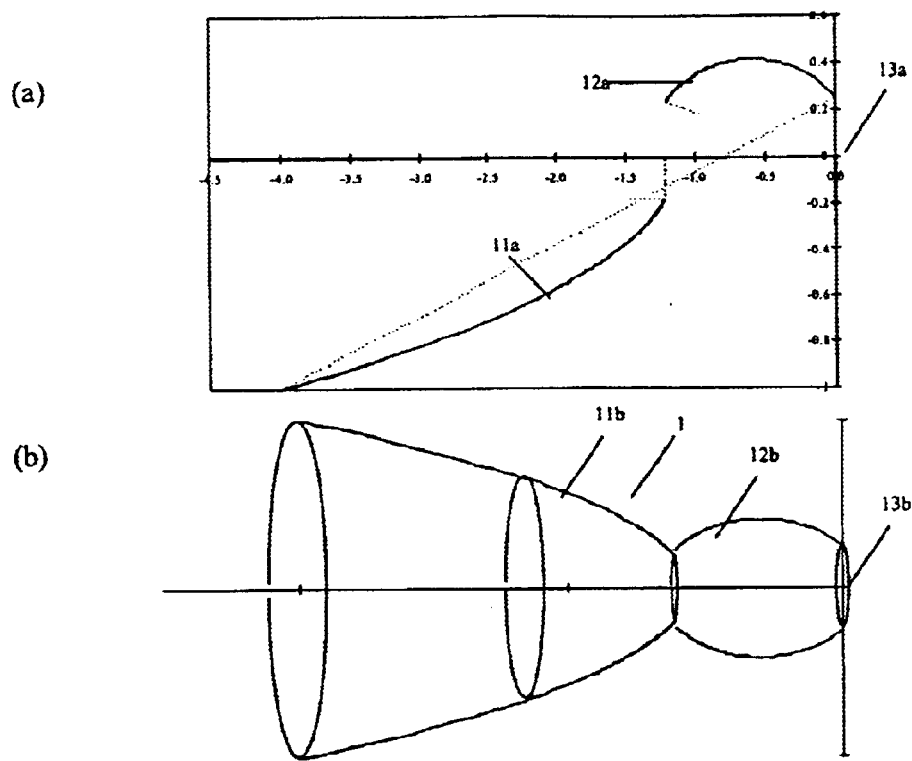

Examples of two-mirror devices according to the invention produced by following the above design steps are illustrated in FIG. 1 and also in FIGS. 2, 3, and 4 for different pairs of values of parameters k and q. FIG. 1a illustrates how the mirror surfaces of such a device 1 are defined by rotation of corresponding curves 11a, 12a as explained above, the curves being shown graphically. The image plane 13a is shown in the plane of y-axis and orthogonal to the x-axis. FIG. 1a has been seeded with the parameters $a_3=90°$, $d_2(0)=-90°$, $p_2(0)=0.25$, $M_3(0)=(0,0)$ and $M_1(0)=(-4,-1)$, $M_0(0)=(-10°,0)$, $B=1/p_1$ and $Z=+1$, and spans about 96% of the complete angle span possible. The resultant device 1, comprising mirrors 11b, 12b together with in a preferred embodiment a plane mirror 13b in the image plane is shown in perspective view in FIG. 1b. The device 1 provides a largely complete angle span onto the image. It is relatively straightforward to show that the devices illustrated also satisfy the sine criterion and thus all the requirements described above for first order aplanatism. In these examples, in contrast to the description in Siemens-Reiniger-Werke Aktiengesellschaft, the iteration has been extended to wholly oblique angles.

It should be noted that only within certain ranges of k and q will neither the edge of the inner mirror furthest from the image nor the edge of the outer mirror nearest to the image occlude rays that would otherwise strike the image tangentially. All three of the devices illustrated in FIGS. 2, 3, and 4 are within these bounds (FIG. 2 only just so). FIGS. 3 and 4 have been chosen so that the two mirrors join up, i.e.:

$$m_{2,y}(0) = -m_{i,y}(0) \rightarrow (m_{2,x}(0)^2 m_{2,y}(0))^{1/2} 1$$

In general the positioning of the mirrors [11b, 12b for device 1; 21, 22 for device 2; 31, 32 for device 3; 41, 42 for device 4 does not appear to be conveniently describable by analytic formulae, although in the special case where the device is symmetric and B=1 the cross-section consists of two equally sized confocal truncated ellipses as shown in cross-section in FIG. 5.

Light from a far away source subtending a sufficiently small angle onto a device constructed as shown in FIG. 2 would, with idealised minors, be concentrated to about 98% of the thermodynamic upper limit. The corresponding concentrations for FIG. 3 and FIG. 4 are about 93% and 50% respectively. These figures can be calculated as the proportion of aperture area through which light passes and is deflected onto the image, i.e. $1 - m_{1,y}(0)^2/b^2$. It appears that if the constraint is imposed that the two mirrors join up then however small k is no occlusion of rays takes place (for an object that subtends a sufficiently small angle onto the device), i.e. with idealised mirrors it would be possible to approach arbitrarily dose to the thermodynamic upper limit for a small source. The applicant has tested this down to k=0.05, i.e. equivalent to 99.7% of the thermodynamic upper limit. At these levels of thermodynamic efficiency the impact of aberrations or the imperfections of real-life mirrors would dominate the losses due to the very slightly incomplete span of angles onto the image plane. However the device would be highly elongated (aperture width 2 but length from aperture to image plane of circa 11.3).

The impact of aberration, whilst noticeable, should usually be manageable as long as the source subtends a relatively small angle. Taking solar energy uses as an example, the sun subtends an angle of about 0.5° at the surface of the earth. An analysis of the aberration characteristics using the sorts of techniques described above indicates that the proportion of light falling other than in the region that the image of the sun would form in the aplanatic ideal is at most only a few percent, at least for the device shown in FIG. 3. Note that from the preceding analysis above, the degree of aberration G(h) arising from the two mirror arrangements is such that the aberration shifts where the ray strikes the image plane by the same amount and in the same direction for both positive and negative h. Therefore, a particular point at the edge of the sun would no longer produce a point image but would produce one that looks approximately like a line, with the line extending somewhat further away from the centre of the image than the thermodynaic ideal would require. If desired, it would be possible to get closer to the thermodynamic ideal by shifting $M_3(t)$ in the opposite direction rather than having it fixed at the origin, but still rotating the resulting cross-sections around the x-axis rather than using more mirrors to achieve higher order aplanatism.

The size of the object makes no practical difference to the degree of aberration for solar energy purposes, and for this purpose large aperture area, e.g. at least 1 $m^2$ is likely to be desirable (on the surface of the earth this would create an image of approximately 0.25 $cm^2$ in area). For high resolution optics, control of aberration becomes much more important, and it may be desirable to make the device as large as possible to reduce the impact that aberrations might have.

The ultra-high resolution aspects of the invention arise because there is an inherent link between the ability to achieve ultra-high resolution in the manner described below and the presence of an ultra-high numerical aperture imaging layout. It has traditionally been considered impossible to circumvent the inherent resolution limits associated with diffraction. In fact, these limits only actually apply to "far field" devices, see e.g. T. Ito & S. Okazaki, "Pushing the limits of lithography", *Nature*, 406, 1027–1031 (2000). This is because it is possible to achieve higher resolution using the optical equivalent of a scanning funnelling microscope or equivalent lithographic device (i.e. a scanning near field optical microscope or SNOM) or by proximity mask lithography, in which the lithographic mask is placed directly on top of the surface onto which the image is being projected. However, neither of these is ideal from the perspective of manufacture of small-scale semiconductor architecture. The SNOM can only create an image one point at a time (or maybe a few points at a time if several SNOM's are linked together), whilst proximity mask lithography requires the mask to be made to the same accuracy as is intended for the image itself, which would present considerable practical difficulties.

Using the present invention, it is possible achieve the same goals without the same difficulties using an ultra-high numerical aperture imaging device and some other components. The following explanation concentrates on the methodology as applied to electromagnetic waves, although the same principles apply to other sorts of waves, e.g. sound waves or electron waves in electron optics.

The solution to Maxwell's equations caused by a (magnetic) dipole disturbance in a vacuum radiating from a point on a perfectly conducting plane mirror exactly satisfies the boundary conditions applicable to such a mirror if the direction of the dipole is in the mirror plane. Therefore the exact solution to the wave equation from such a dipole source in the presence of such a mirror is given by the dipole solution, which radiates with a (hemiyspherical wavefront away from the dipole source (although not one that has a uniform amplitude or polarisation across the entire wavefront).

Maxwell's equations are time reversible. This means that if a disturbance is arranged to occur on a hemiyspherical shell (the focal point of which lies on the plane mirror), the disturbance having the same spatial distribution of electric and magnetic fields as an outwardly radiating dipole positioned at the centre of that shell would generate, but with the direction of either the electric or the magnetic field reversed then the resulting exact solution to Maxwell's equations would be the corresponding imploding dipole solution, at least up to the time that the wavefront was arbitrarily close to the centre of the hemisphere.

Suppose that the perfectly conducting plane mirror is replaced with one that contains some holes, the size of each being small compared to the distance between it and its nearest neighbor. Suppose also that the boundary conditions on the surface surrounding the mirror are arranged to be a superposition of the boundary conditions required to generate imploding dipole disturbances as above, each dipole imploding to the centre of a different hole. Then, as Maxwell's equations are linear, the resulting exact solution to Maxwell's equations is the superposition of the solutions arising from each individual imploding dipole disturbance. However, because the electric and magnetic fields of dipole solutions increase rapidly (indeed in principle become infinite) at their centre, essentially the whole of any light flux passing through the mirror arising from a specific imploding dipole disturbance does so in this instance through the hole on which it is centred, with essentially none of the flux going through any other hole.

At least in this limiting case, there is thus a one-to-one correspondence between component parts of the superposition of wavefronts at the boundary and the points through which the flux passes through the mirror, and therefore the points at which an image would be recorded were an image recorder or other photosensitive material to be positioned a small fraction of a wavelength the other side of the plane mirror. Note that this result is independent of the wavelength of the light involved, and hence is not subject to any diffraction based limitation as would normally be applicable to imaging systems, although it is necessary to create a fine mesh of holes to achieve the desired result and the design would therefore be constrained by the optical properties of conductors available in the real world. An alternative to creating a fine mesh of holes would be to use a mirror that was sufficiently thin to allow some light through, as this can be thought of as a limiting example of the same approach but with the holes being spread uniformly across the conductor surface.

To create an image which is not diffraction limited it is then necessary only to identify some means of achieving an equivalent one-to-one correspondence between component parts of the superposition surrounding the mirror next to the image and points in the object.

This will necessarily involve the use of an ultra-high numerical aperture device, since the approach needs to be imaging in the geometrical optical sense (to cope with the situation where the wavelength tends to zero) and it needs to span the full or nearly full range of angles onto the image plane, in order for it to be possible to approximate the boundary conditions needed to create an imploding dipole solution around a complete hemisphere surrounding the centre of the image plane.

The simplest approach is to use a large, highly elongated, symmetric, double, equally sized confocal truncated ellipsoidal mirror arrangement, as shown in cross-section in FIG. 5, in conjunction with a plane mirror 53 placed at the far end of the ellipsoidal mirrors 51, 52 from the relevant light source and a plane mirror 54 at the near end of these mirrors and for the plane mirors 53 and 54 both to contain a suitable pattern of small holes. If the holes are small enough then the light source transmitted though the plane mirror 54 will consist of a superposition of outwardly radiating (magnetic) dipoles, one for each hole and if the ellipsoidal mirrors 51, 52 are sufficiently large and sufficiently elongated then for each such dipole the outwardly radiating wavefronts are deflected in such a manner by the ellipsoidal mirrors to create the boundary conditions required to create inwardly-radiating dipoles as the wavefronts approach the plane mirror 53 next to the image.

However, such a double truncated ellipsoidal mirror arrangement 5 provides no magnification. It therefore suffers from the same practical difficulties as a proximity mask lithographic device. Better would be to use an ultra-high numerical aperture imaging system that spans nearly the complete range of angles onto the mirror next to the image and which provides some magnification. This is possible to the level of first order aplanatism using just two mirrors. FIG. 1b illustrates one such device whose mirror surfaces are defined by rotation of corresponding curves as explained above. The device as in FIG. 1b provides an angle span onto the image to about 96% of the complete angle span possible. Stubbier versions would span a smaller proportion of the complete angle span, elongated versions a larger proportion (with arbitrarily elongated versions spanning an arbitrarily high proportion). As indicated in the preceding analyses, it would also be possible to construct an arrangement involving additional mirrors or lenses, to achieve higher orders of aplanatism.

As noted previously, one practical use for devices according to the present invention is in the field of photolithography. An example device arranged for this purpose is illustrated in cross-section in FIG. 6. In this case the two mirrors have surfaces defined by b=1, k=0.25, q=1.832 as for the embodiment shown in FIG. 2, except that in this case the object plane has been taken as x=−6 rather than far away (x) along the negative x-axis. The device 6 comprises two mirrors 61, 62 which in this case are not joined (so that a discontinuity 63 exists between the two). The mirror 62 abuts the image plane 64 which is as shown in the enlargement of area "A" in FIG. 7. A plane mirror 64a, partially transparent, in this case by having many very small holes 66 (a small fraction of the imaging wavelength wide, but positioned much further apart than they are wide) is positioned in the imaging plane with an image recording element 67 (the device or object on which the image is to be projected) disposed a small fraction of the imaging wavelength behind the mirror 64a. Optionally, the device may include additional components 68 (as discussed further below) to modify the rays coming from the object to more closely approximate the desired imploding dipole solution.

Correspondingly, for the example of FIG. 6, and as shown in the enlargement in FIG. 8, the object, in this case a photo-lithographic mask 80 is positioned adjacent to a plane mirror 65a, this mirror also being provided with many very small holes 69 (a small fraction of the imaging wavelength wide, and positioned much further apart than they are wide) at conjugate points to those in the mirror 64a in the image plane.

If non-zero magnification is desired it is important to note that whilst the shape of the wavefronts far away from a mirror in the image plane may be as required to generate an imploding dipole solution, the spatial distinction (and polarisation) of the resulting electric and magnetic vectors along the wavefront will not. Instead it will be necessary to attenuate the light (and to rotate the polarisation, probably after having discarded one of the two perpendicular polarisation components) to a different amount depending on the direction in which that part of the wavefront approaches the image plane. However, this is not as impractical as it may first appear. If the required modifications to the amplitude and polarisation are done far away from the image, object and any caustic in between, then the spatial distribution of the required adjustments happens to be the same for each dipole component, being focused in a region near the centre of the image plane, and therefore any such adjustment made to one such dipole component will simultaneously provide the necessary adjustments to all other such components.

Consider the electric field generated by a (magnetic) dipole in the object plane pointing in a direction n parallel to the object plane. The following analysis uses spherical polar coordinates r=(r, θ, φ) where r is the distance from the centre of the dipole, θ is the angle between the vector r and the axis of symmetry and θ is the angle that the projection of r onto the object plane makes to some fixed vector in that plane.

The direction and amplitude of the electric field created by such a dipole is given by E=(r×n)f(r,t) where f(r,t) is a function of time and the size of r but not its direction (and × is the vector product operator). The spatial distribution of its amplitude is therefore proportional to |r×n| and the angle that it makes to $e_θ$, the unit vector in the direction of increasing θ, is α(r,n), say, where α(r,n)=arcsin(|(r×n)×$e_θ$|/(|r×n||$e_θ$|)).

Unadjusted, this will then create an electric field on a hemisphere surrounding the image plane which has direction and amplitude as follows (using spherical polar coordinates r'=(r', θ', φ') where r' is the distance from the corresponding point on the image plane to the source of the dipole and θ is the angle between the vector r' and the axis of symmetry and φ is the angle that the projection of r' onto the image plane makes to the same fixed vector as was used to define φ):

(a) The amplitude at the point r'=(r', θ'φ) where θ'=arcsin(M .sin(θ)), M defining the magnification provided by the device, is apparently proportional to |r×n| √cos(θ)/cos(θ').

(b) The direction at that same point (as given by the angle that it makes to $e'_θ$, the unit vector in the direction of increasing θ') is evidently a(r,n).

However, for such a wavefront to create an imploding dipole of the required form, the amplitude actually needs to be proportional to |r'×n'| where n' is a vector parallel to the image plane, and to have a direction given by α(r',n'), where $$α'(r',n')=\arcsin(|(r'×n')×e_θ|/(|r'×n'||e_θ|)).$$

Only in the special case where M is unity is this the case (with n'=n). If M is not unity then to create the imploding dipole it would be necessary to insert into the system three further components. For example, as illustrated in FIG. 7, it would be possible to use, say, three hemiyspherical shells 68 in front of the image plane, each with its centre at the centre of the image plane (and relatively far from the image plane compared to the imaging wavelength), each consisting of lots of small hexagonal tiles, the tiles having appropriate properties. The tiles in the outermost shell 68a may each contain a polarising filter to ensure that the direction of polarisation of the electric field immediately after passing through it makes an angle of α(r,n) to $e'_θ$. Such an adjustment may be required to discard one of the two independent polarisations that would normally be radiated from the object, as it does not appear to be possible to arrange for the above requirements to be satisfied simultaneously by both such polarisations. The tiles in the next shell in 68b may optionally contain different amounts of an optically active substance to rotate the incoming light so that its electric field no longer makes an angle α(r,n) but makes an angle α(r,n) but makes an angle α(r',n) to $e'_{74}$ (but preferably without changing the optical path length). The tiles in the innermost shell 68c may contain different amounts of a semi-transparent substance so that light falling on different tiles may be attenuated by the right amount to match that required for an imploding dipole solution. There are lots of variants on this basic theme, e.g. for far away light it would be simpler to replace the outermost hemispherical shell 68a with a plane sheet perpendicular to the axis of symmetry placed between the object and the aperture, since the polarisation direction it needs to accept would be everywhere the same.

The above description has concentrated on the use of such an ultra-high resolution apparatus for purposes such as photolithography. It is also possible to use this approach to improve the resolution of telescopes or microscopes, although the image formed by applying this method directly would have features that were only a small fraction of a wavelength in size and might therefore be difficult to read. Attentively, a plane mirror with small holes spread out over its surface each, say, several wavelengths from each other, may be placed in the image plane of an ultra high numerical aperture telescope/microscope lens or mirror arrangement and the image viewed from the other side of the mirror with a more traditional microscope. The resulting image would be diffraction limited, but its amplitude at points in the final image corresponding to each hole in the plane mirror would very largely relate to light from conjugate points in the object, rather than other points near to these conjugate points but too dose to be effectively resolved by a traditional telescope. Therefore, by observing how these amplitudes vary when the plane mirror (and hence the holes in the mirror) is moved by small fractions of a wavelength in each direction, it would then be possible to build up a higher resolution picture of the object than available with a traditional diffraction limited telescope/microscope (the downside being that a high proportion of the light falling on the telescope/microscope would be rejected, producing a fainter resultant image).

Similar results also apply to scalar waves, e.g. sound waves. Indeed because the corresponding (scalar) dipole solution is zero on the image plane everywhere except at the exact centre of the dipole (if the dipole is pointing in the right direction), it would appear that the mirror immediately in front of the image recorder can be dispensed with. Indeed, even with vector waves such as electromagnetic waves, this mirror may be unnecessary. If we create boundary conditions equivalent to those required for an imploding (magnetic or electric) dipole, the direction of the dipole being parallel to the image plane, then in the absence of the plane minor the resulting solution to Maxwell's equations is not that of an imploding (magnetic or electric) dipole. However, each Cartesian component of the electric and magnetic field is still itself a solution to the scalar wave equation. For the component of the electric field (for a magnetic dipole) or the magnetic field (for an electric dipole) parallel to the image plane the mathematics seems to be the same as for the imploding scalar dipole referred to above, and therefore it is possible that it is zero everywhere on the image plane except at the exact centre of the dipole even when no plane mirror is present there. Therefore in this instance it would seem that there is no energy flow except at the exact centre of the dipole even when no plane mirror is present in the image plane. Such a result seems to be consistent with a recent paper by J. B. Pendry "Negative Refraction Makes a Perfect Lens", *Physical Review Letters* 85, No 8 3966–3969 (2000). The author of that paper claims that it is possible to produce a diffraction free lens using a lens made of material with a negative refractive index. His paper demonstrates that, with this unusual type of lens, evanescent waves that normally disappear when light passes through a lens arrangement reappear in the wavefront as it approaches the origin, which is similar to the wavefront that the apparatus disclosed here should create. Thus if Pendry's claim is correct then the apparatus disclosed here should also be diffraction free even without a partially transparent plane mirror in the image plane.

What is claimed is:

1. A method of designing a two-mirror high numerical aperture imaging device comprising the steps of:

(a) determining the position of each consecutive point of a cross-section through the x-axis of a first mirror located nearest an object for imaging in use and a second mirror located nearest the image in use, iteratively for a cross-section in the plane z=0, where the x and y coordinates of each successive point on the first and second mirrors in the cross-section are determined by the functions $M_1(t) \equiv (m_{1,x}(t), m_{1,y}(t), 0)$ and $M_2(t) \equiv (m_{2,x}(t), m_{2,y}(t), 0)$ respectively, t being an iteration counter; where the functions $M_0(t) \equiv (m_{0,x}(t), m_{0,y}(t), 0) \equiv (f, 0, 0)$ and $M_3(t) \equiv (m_{3,x}(t), m_{3,y}(t), 0) \equiv (0, 0, 0)$ are set to define the centres of an object plane and an image plane, respectively; where $a_1(t)$ and $a_2(t)$ are the angles that tangents to the first and second mirrors make to the z-axis, and $a_0(t)$ and $a_3(t)$ are the angles that the object and image planes make to the x-axis (being 90° for all t for the mirrors to be rotationally symmetric about the x-axis); $d_i(t)$ (for i=0, 1, 2) is the angle that a ray from $M_i(t)$ to $M_{i+1}(t)$ makes to the x-axis and $p_i(t)$ (for i=0, 1, 2) is the distance between $M_i(t)$ and $M_{i+1}(t)$, so that:

$$d_i(t) = \arctan\left(\frac{m_{i+1,y}(t) - m_{i,y}(t)}{m_{i+1,x}(t) - m_{i,x}(t)}\right)$$

$$a_i(t) = \frac{d_i(t)}{2} + \frac{d_{i-1}(t)}{2}$$

$$p_i(t) = \sqrt{(m_{i+1,x}(t) - m_{i,x}(t))^2 + (m_{i+1,y}(t) - m_{i,y}(t))^2}$$

(b) selecting suitable parameters to define the size and shape of the device—for use with a far away source (of the order of $f = -10^9$ distant along the negative x-axis) define the overall width of the device by the value of B, $B = b/p_0(0)$; define two further parameters $m_{2,y}(0) = k$ and $m_{2,x}(0) = -q$, and taking $m_{1,x}(0) = m_{2,x}(0) - \delta$, where $\delta$ is small or 0 (thereby defining one limit of the acceptable range of iterated values);

(c) assigning values to $m_{1,y}(0)$ and Z:

$$Z = 1 \quad m_{1,y}(0) = -\frac{m_{2,y}(0)}{(m_{2,x}(0)^2 + m_{2,y}(0)^2)^{1/2}}$$

(d) updating the values of $M_1(t)$ and $M_2(t)$ according to the following iterative formulae for a small value of h, where $w_i(t)$ is a function corresponding to the distance between $M_i(t)$ and $M_i(t+1)$ and $r_{i-1}(t) = \sin(a_{-1}(t) - d_{i-1}(t))$ $s_i(t) = \sin(a_i(t) - d_{i-1}(t))$ $$M_i(t+1) \equiv \begin{pmatrix} m_{i,x}(t+1) \\ m_{i,y}(t+1) \end{pmatrix} = M_i(t) + w_i \begin{pmatrix} \cos(a_i(t)) \\ \sin(a_i(t)) \end{pmatrix} h$$

where the distance parameters $w_i(t)$ for $w_1$, $w_2$, $a_1'w_1$ and $a_2'w_2$ satisfy the four simultaneous equations:

$$w_2 h = E_1(w_1 h, 0) 0 = E_2(w_2 h, w_1 h) \quad w_2 h = E_1(0, h) \quad ZBh = E_2(w_2 h, 0)$$

(h corresponding to the distance away from the centre that rays eventually strike the image plane a distance ZBh from its centre and $a_i'(t)g_i$ is the difference between the angle that the i'th mirror makes to the x-axis at point $M_i(t)$ and the angle that it makes at a distance $g_i$ from $M_i(t)$, for a smooth surface this being a linear function of $g_i$ for small $g_i$, $a_i'(t)$ being the derivative of $a_i(t)$ with respect to t); $w_1(t)$ and $w_2(t)$ further satisfying the relationships:

$$w_2 h = E_1(0, h) \frac{p_1 r_0 h}{p_0 s_2} \ 0 - ZBh = (E_2(w_2 h, w_1 h) - E_2(w_2 h, 0)) = \frac{p_2 r_1}{p_1 s_3} w_1 h$$

where $E_i(g_i, g_{i-1})$ represents the distance from $M_{i+1}(t)$ that a ray will strike the i+1'th surface if it comes from a point on the i−1'th surface that is a distance $g_{i-1}$ from $M_{i-1}(t)$ via a point on the i'th surface that is a distance $g_i$ from $M_i(t)$, for small $g_{i-1}$ and $g_i$, such that for deflection by reflection:

$$E_i(g_i, g_{i-1}) = \left(\frac{r_i}{s_{i+1}} - \frac{p_i s_i}{p_{i-1} s_{i+1}}\right) g_i + \left(\frac{p_i r_{i-1}}{p_{i-1} s_{i+1}}\right) g_{i-1} + \left(\frac{2 p_i}{s_{i+1}}\right) a_i' g_i$$

i.e. $w_2 = \frac{p_1 r_0}{p_0 s_2} \quad w_1 = -ZB \frac{p_1 s_3}{p_2 r_1}$ (e) ending the iteration when $m_{2,x}(0)$ approaches zero thereby defining the other limit of the acceptable range of iterated values;

(f) rotating the curves thus produced, which define the shapes of the two mirrors, around the x-axis to define a complete, three-dimensional two-mirror arrangement.

2. A high numerical aperture imaging device comprising at least two mirrors made according to the method of claim 1.

3. A high numerical aperture imaging device (1) according to claim 2 comprising first and second axially-symmetric curved mirrors (11b,12b) for focussing the image of an object onto an image point (13a), wherein the first and second curved mirrors (11b,12b) are arranged to effectively create inwardly imploding dipole-like solutions to the applicable wave equation, to concentrate the energy flux arriving at the image plane (13a) from a given point in the object more than would be possible were the image formation to be subject to the diffraction limits that generally apply to far field devices.

4. A device according to claim 3 further comprising a wave attenuation element (68c) and a wave polarisation-rotating element (68a) designed so that the spatial distribution of the amplitude and polarisation of a wavefront as it approaches the image plane is rendered more closely consistent with that required to generate dipole-like solutions to the wave equation.

5. A high numerical aperture imaging device (1) according to claim 2 further comprising a partially transparent plane mirror (13b) positioned proximate to the image plane.

6. A device according to claim 5 further comprising a wave attenuation element (68c) and a wave polarisation-rotating element (68a) designed so that the spatial distribution of the amplitude and polarisation of a wavefront as it approaches the image plane is rendered more closely consistent with that required to generate dipole-like solutions to the wave equation.

7. A device (6) according to claim 3 adapted to produce highly accurate lithographic images for use in semiconductor/microchip manufacture.

8. A device according to claim 2 adapted to concentrate waves satisfying equivalent 'ballistic' equations of motion.

9. A device according to claim 2 adapted to project waves satisfying equivalent 'ballistic' equations of motion.

10. A device according to claim 2 adapted to concentrate physical entities other than waves which satisfy equivalent 'ballistic' equations of motion.

11. A device according to claim 2 adapted to project physical entities other than waves which satisfy equivalent 'ballistic' equations of motion.

12. A device according to claim 2, wherein the mirrors retain their required shape by being part of an inflated structure.

13. A device according to claim 2, wherein the mirrors retain their required shape by being rotated at a sufficiently rapid speed.

14. A device according to claim 12 adapted to concentrate sunlight to a high temperature for the purpose of generating electric power.

15. A device according to claim 12 in which concentrated sunlight is used to create direct thrust for powered flight by evaporation of a propellant.

16. A device according to claim 13 adapted to concentrate sunlight to a high temperature for the purpose of generating electric power.

17. A device according to claim 13 in which concentrated sunlight is used to create direct thrust for powered flight by evaporation of a propellant.

18. A device according to claim 2 for interlinking of optical networking components, the device further comprising a solid state optical emitter in the source/image plane.

19. A device according to claim 2 for interlinking of optical networking components, the device further comprising a solid state detector in the source/image plane.

20. A device according to claim 2 in which the first and second mirrors are joined, such that: $m_{2,y}(0) = -m_{1,y}(0) \rightarrow (m_{2,x}(0)^2 + m_{2,y}(0)^2)^{1/2} = 1$.

21. A device according to claim 2 in which the shape of the first and second mirrors is further modified to compensate for higher order aberrations by deviating from the aplanatic ideal in such a way that rays coming from a circular or far away spherical object fall primarily within a circular shaped image, the circle being smaller than the shape of the image that would be formed by the corresponding ideal aplanatic arrangement.

22. A high numerical aperture device according to claim 2 further comprising at least one additional surface adapted to exhibit aplanatism of order greater than one.

23. A high numerical aperture device according to claim 3 further comprising at least one additional surface adapted to exhibit aplanatism of order greater than one.

24. A high numerical aperture device according to claim 4 further comprising at least one additional surface adapted to exhibit aplanatism of order greater than one.

25. A high numerical aperture device according to claim 5 further comprising at least one additional surface adapted to exhibit aplanatism of order greater than one.

26. A high numerical aperture device according to claim 6 further comprising at least one additional surface adapted to exhibit aplanatism of order greater than one.

27. A high numerical aperture device according to claim 7 further comprising at least one additional surface adapted to exhibit aplanatism of order greater than one.

* * * * *